US008901998B2

United States Patent
Moronvalle et al.

(10) Patent No.: US 8,901,998 B2
(45) Date of Patent: Dec. 2, 2014

(54) CURRENT-VOLTAGE CONVERTER HAVING A CURRENT REFLECTOR, INPUT STAGE OF AN AMPLIFIER AND CORRESPONDING AMPLIFIER

(75) Inventors: Mathias Moronvalle, Vauhallan (FR); Pierre-Emmanuel Calmel, Versailles (FR)

(73) Assignee: Devialet, Paris (FR)

( * ) Notice: Subject to any disclaimer, the term of this patent is extended or adjusted under 35 U.S.C. 154(b) by 63 days.

(21) Appl. No.: 13/582,333

(22) PCT Filed: Mar. 16, 2010

(86) PCT No.: PCT/FR2010/050473
§ 371 (c)(1),
(2), (4) Date: Nov. 21, 2012

(87) PCT Pub. No.: WO2011/107671
PCT Pub. Date: Sep. 9, 2011

(65) Prior Publication Data
US 2013/0057351 A1      Mar. 7, 2013

(30) Foreign Application Priority Data

Mar. 3, 2010 (FR) .................................... 10 51541

(51) Int. Cl.
*H03F 3/04*     (2006.01)
*H03F 1/32*     (2006.01)
*H03F 1/08*     (2006.01)
*H03F 1/30*     (2006.01)

(52) U.S. Cl.
CPC .............. *H03F 1/3205* (2013.01); *H03F 1/086* (2013.01); *H03F 2200/03* (2013.01); *H03F 1/301* (2013.01)

USPC .............................................. 330/11; 330/288

(58) Field of Classification Search
USPC ...................... 330/11, 288, 290, 311; 327/103
See application file for complete search history.

(56) References Cited

U.S. PATENT DOCUMENTS

| 4,563,655 | A | * | 1/1986 | Merrick ......................... 330/285 |
| 6,963,244 | B1 | | 11/2005 | Carter |
| 7,164,317 | B1 | | 1/2007 | Lorenz |

OTHER PUBLICATIONS

International Search Report for PCT/FR2010/050473 dated Sep. 24, 2010.

* cited by examiner

*Primary Examiner* — Steven J Mottola
(74) *Attorney, Agent, or Firm* — B. Aaron Schulman, Esq.; Stites & Harbison, PLLC.

(57) ABSTRACT

A current-voltage converter with a current reflector, for which the input current includes a fixed component and a variable component, includes an input for the current to be converted, an output for the converted voltage, two constant current sources each connected between the output and a respective reference voltage, at least one MOSFET transistor mounted in series with each constant current source, and a resistor for converting the current into a voltage, arranged between the output and ground. The gate of each MOSFET transistor is connected to one of the reference voltages. The input for the current to be converted is connected to the output through one of the MOSFET transistors. The converted further includes, for each MOSFET transistor, means for re-injecting into at least one of the current sources, a current equal to the current absorbed in the gates of the MOSFET transistors.

13 Claims, 5 Drawing Sheets

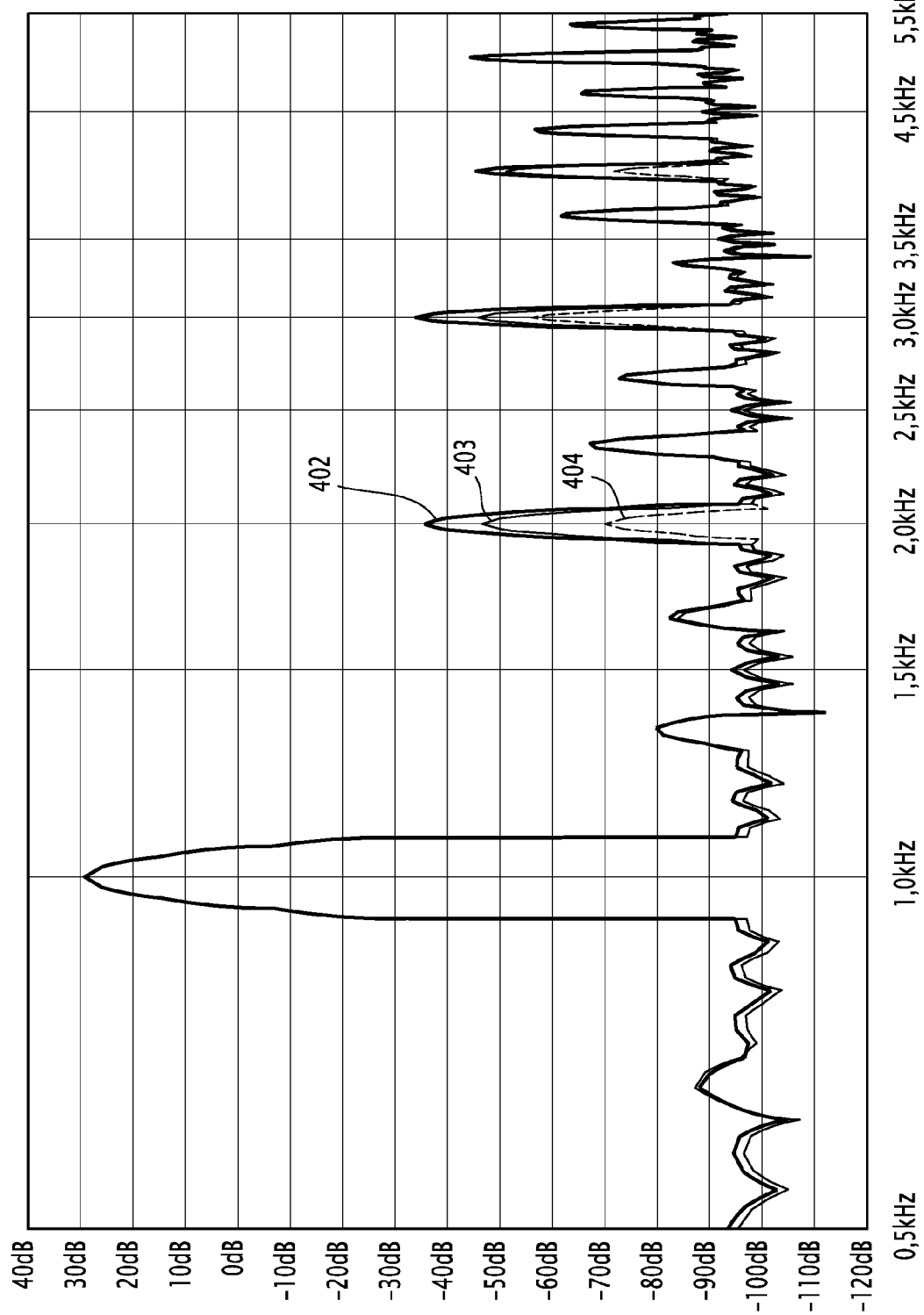

CURRENT-VOLTAGE CONVERTER HAVING A CURRENT REFLECTOR, INPUT STAGE OF AN AMPLIFIER AND CORRESPONDING AMPLIFIER

The present invention relates to a current-voltage converter having a current reflector, the input current including a fixed component and a variable component, the converter including:
- an input for the current to be converted;
- an output for the converted voltage;
- a current-to-voltage conversion resistor arranged between the output and the ground, the input being connected to the output for circulating the current to be converted in the resistor; and
- a current reflector circuit including two constant current sources connected between the output and a respective reference voltage.

Such a converter finds its application in particular in a high fidelity amplifier having high linearity and a low thermal distortion rate. It is common, in such an amplifier, to use at the input, a digital-analog converter such as the component PCM 1792 from Texas Instruments. This converter has a current output so that the analog signal is intensity-modulated.

Insofar that the amplification stage placed downstream uses at the input a modulated voltage, a current-voltage converter should be placed between the analog-digital converter and the actual amplification stage.

Digital-analog converters with a current output are particularly appreciated since they are insensitive to thermal distortions, as the latter operate at constant power.

Indeed, current sources are switched between the ground and an output set to a virtual ground traditionally achieved with an operational amplifier circuit. In this way, all the transistors of the converter operate at constant current and voltage, therefore at constant power, regardless of the modulation of the output signal.

However, the difficulty of preserving this absence of thermal distortion is transferred onto the next two stages, i.e., the current-voltage converter and the associated voltage gain stage. Traditionally, the current-voltage converter is made from an operational amplifier circuit, the output of which is limited to a few volts in amplitude. The operational amplifier is followed by a transistor circuit in order to ensure a rise in the voltage.

These solutions, although they are complex and costly, however significantly degrade the initial performances by introducing harmonic and thermal distortion, delay and intermodulation and transient distortion, notably due to the operational amplifier.

The object of the invention is to make a current-voltage converter incorporating a gain stage, which degrades less the performances of the digital-analog converter such as PCM 1792 placed upstream.

For this purpose, the object of the invention is a current-voltage converter with a current reflector of the aforementioned type, characterized in that it includes a cascode stage mounted in series with each constant current generator in order to impose a constant potential difference on the terminals of each constant current generator regardless of the output voltage.

According to particular embodiments, the converter includes one or more of the following features:
- the input for the current to be converted is connected to the output through one of the cascode stages mounted in series with the constant current generators;
- the converter includes, for each cascode stage, means for re-injecting a current equal to the current absorbed in the current reflector circuit;
- the converter includes, for each cascode stage, means for measuring the absorbed current for the cascode stage;
- the current measurement means include a measurement current mirror circuit mounted on the circuit for controlling the gate of each transistor of a cascode stage, and the means for re-injecting the current absorbed in the current reflector circuit comprise means for adding both currents obtained at the output of the measurement current mirrors and inverting their sign, the output of the adding and inverting means being connected to the current mirror circuit for injecting into the current reflector circuit the opposite of the sum of currents obtained at the output of the measurement current mirror circuits,
- the means for adding both currents obtained at the output of the measurement current mirrors and inverting the sign thereof comprise for each current mirror, a sign inversion current mirror mounted in series, the outputs of both sign inversion current mirrors being connected together to the current reflector circuit;
- the means for re-injecting the absorbed current include means for injecting a connection signal into the current generator associated with the cascode stage so that the current generator provides a current increased by the current absorbed by the cascode stage;
- the re-injection means are able to re-inject a current equal to the current absorbed in the current reflector circuit for audible frequencies, such as frequencies below 20 kHz, and the converter includes means for stabilizing the voltage delivered on the output in order to reduce the re-injection current rate for frequencies above audible frequencies, such as frequencies above 20 kHz, the re-injection rate being equal to the amount of re-injected current, divided by the amount of absorbed current ;
- the stabilization means include a low-pass filter;
- the converter is without any operational amplifier.
- the intensity difference between both constant current sources is equal to the fixed component of the input current.

The object of the invention is also an input stage of a high fidelity amplifier having high linearity and low distortion rate including a digital-analog converter with a current output and a current-voltage converter as defined above. The object of the invention is also a high fidelity amplifier having high linearity and low distortion rate including an input stage as defined above and an amplification stage, no voltage gain stage being interposed between the current-voltage converter and the amplification stage.

According to a particular embodiment, the amplifier includes the following feature:
- the conversion resistance has a value greater than or equal to the difference between the extreme values of the voltage at the output of the amplification stage divided by the difference between the extreme values of the intensity of the current at the input of the current-voltage converter.

The invention will be better understood upon reading the description which follows, only given as an example and made with reference to the drawings, wherein :

FIG. 5 is a set of curves illustrating the frequency responses for the three embodiments of FIGS. 2 to 4 of the current-voltage converter.

Figure 1:
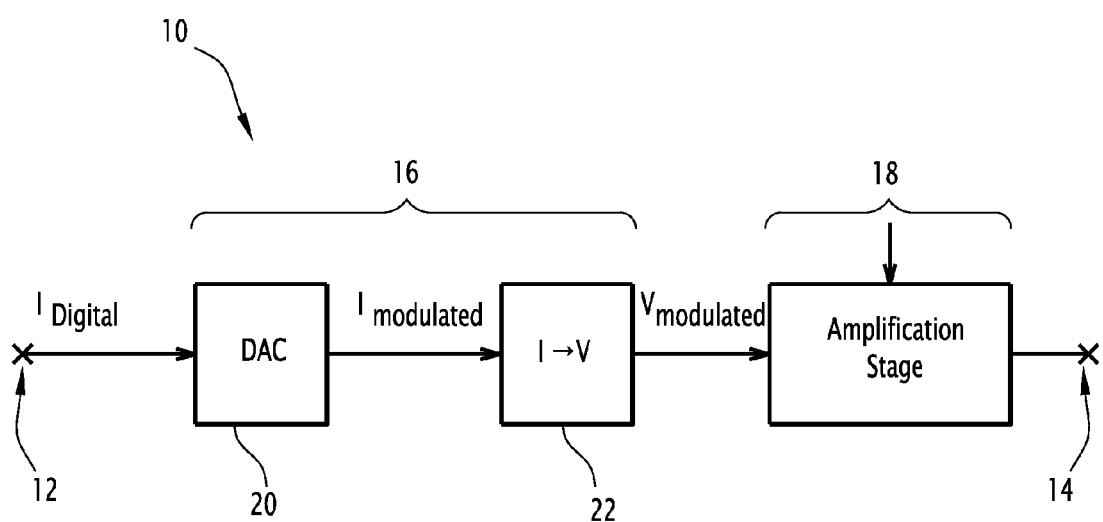
FIG. 1 is a schematic view of a high fidelity amplifier according to the invention.

The amplifier 10, schematically illustrated in FIG. 1 is a high fidelity amplifier able to receive on an input 12 a digital signal and to produce at the output 14 an amplified analog signal.

As known per se, the amplifier includes an input stage 16 ensuring conversion of the input digital signal into a voltage-modulated output analog signal, as well as an amplification stage 18, ensuring that sufficient power is provided for the load placed downstream, i.e. one or several loudspeakers. Preferably this is an amplification stage of class A.

The input stage 16 includes a digital-analog converter 20, the input of which is connected to the input 12 of the amplifier in order to receive a digital signal $I_{digital}$. This digital-analog converter is able to provide at the output a current-modulated analog signal $I_{modulated}$. The digital-analog converter is for example a PCM 1792 from Texas Instruments. The output of the digital-analog converter 20 is connected to a current-voltage converter 22 according to the invention.

Figure 2:
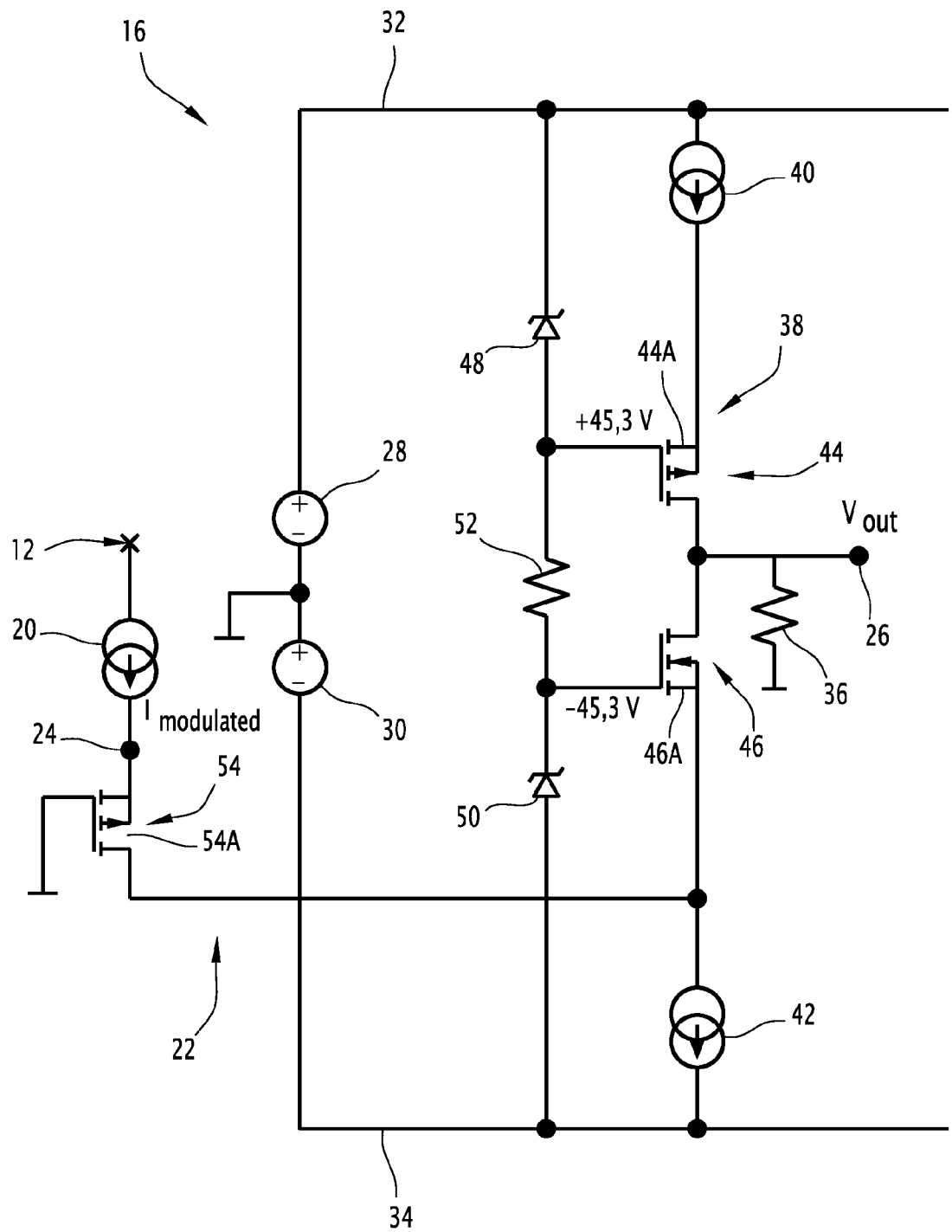
FIG. 2 is an electric diagram of the current-voltage converter of the amplifier of FIG. 1 according to a first embodiment.

This converter is able to provide a modulated voltage $V_{modulated}$ and with a voltage gain from the modulated current $I_{modulated}$ produced by the digital analog converter 20. The output of the converter 22 is connected to the input of the amplification stage 18 as known per se. The input stage 16 is illustrated In FIG. 2. In this view, the digital-analog converter 20 is schematized by a current source.

The current-voltage converter 22 has an input 24 connected to the output of the digital-analog converter 20 and a voltage output 26 able to be directly connected to the amplification stage 18.

The current-voltage converter 22 includes two voltage sources 28, 30, one terminal of which is connected to the ground and the other terminal of which powers two DC voltage buses, 32, 34, respectively, one being maintained at a constant potential of +50V and the other being maintained at a constant voltage of −50V relatively to the ground.

The current-voltage converter 22 includes a conversion resistor 36, one terminal of which is connected to the output 26 and the other terminal of which is connected to the ground.

The input 24 of the converter is connected to the terminal of the resistor 36 forming the output 26 of the converter through a current reflector circuit 38 able to ensure transmission of the entirety of the modulation current $I_{modulated}$ produced by the digital-analog converter up to a conversion resistor 36 referenced to the ground without the modulation current of the digital-analog converter being modified or subject to thermal distortion.

As known per se, the output current of the digital-analog converter 22 comprises a DC component of 6.2 mA and a variable component varying between −4 and +4 mA.

The current reflector circuit 38 is able to cancel out the DC component. For this purpose and as known per se, the current reflector circuit includes a first constant current generator 40 connecting the DC bus 32 to the output 26 and a second constant current generator 42 connecting the output 26 to the voltage bus 24.

Ideally, the current generators 40 and 42 are perfect current generators, the generator 40 being able to provide an intensity of more than 6.2 mA and the current generator 42 being able to provide an intensity equal to that of the generator 40 increased by 6.2 mA.

Under these conditions, the variable component of the output current of the digital-analog converter 20 is entirely directed into the resistor 36, achieving current-voltage conversion, the linearity limitation of which only lies in the flaws of the resistor 36.

The conversion resistor 36 has a value greater than or equal to the difference between the extreme values of the output voltage of the amplification stage 18 divided by the difference between the extreme values of the intensity $I_{modulated}$ of the current at the input of the current-voltage converter 22.

A first cascode stage 44 is mounted in series between the generator 40 and the output 26. Also, a second cascode stage 46 is interposed between the current source 42 and the output 26.

These two cascode stages each include a MOS transistor 44A, 46A, the drain of which is connected to the output 26 and the source of which is connected to the current generator 40 and 42. The gates of both transistors 40, 46 are each maintained at a fixed voltage of +45.3 V and −45.3 V, for the transistors 44 and 46, respectively. For this purpose, the gates of the transistors 44, 46 are respectively connected to the voltage buses 32, 34 through a Zener diode 48, 50. A resistor 52 ensuring the flow of a current of low intensity through the diodes 48, 50 connects the anode of the diode 48 to the cathode of the diode 50. This resistance for example has a value of 100 kΩ.

Preferably, the input 24 of the current-voltage converter is connected between the cascode stage 46 and the current generator 42.

Further, an additional cascode stage 54 is positioned between the input 24 of the converter and the current reflector circuit 38 to which it is connected. This cascode stage includes a transistor 54A of the MOS type, the source of which is connected to the input 24. The drain is connected to the current reflector circuit 38 and the gate is connected to the ground.

It is understood that with the cascode stages 44 and 46 it is possible to obtain that the current sources 40, 42 do not have any voltage variation on their terminals when the output voltage in point 26 varies, even by several tens of volts.

The cascode stages 44, 46 guarantee that the voltage differences on the terminals of the current generator 40, 42 are constantly equal to 2.7V, regardless of the output voltage of the circuit, this voltage on the terminals of the current generator being set to the fixed voltage of 4.7V on the terminals of the diodes 48, 50 reduced by the fixed voltage for example equal to 2V between the gate and the source of each transistor 44A, 46A.

Also, the cascode stage 54 guarantees that the voltage at the output of the digital-analog converter 20 is maintained in the range from 0 to 5V, in order to compensate the fact that the digital-analog converter does not act as a perfect current source. The circuit illustrated in FIG. 2 operates satisfactorily. However, the presence of the cascode stages 44, 46 introduces perturbations because of the presence of parasitic capacitances in the transistors between the drain and the gate on the one hand and between the source and the gate on the other hand. These capacitors undergo charging and discharging when the voltage at the output 26 varies.

These phenomena generate error currents which will be added or subtracted from the current delivered by the digital-analog converter. The current flowing up to the resistor 36 and therefore the voltage on its terminals read from the output 26 will be modified. The importance of this phenomenon is proportional to the frequency of the converted signal since the currents in the capacitances depend on the derivative of the voltage at the output 26.

Figure 3:
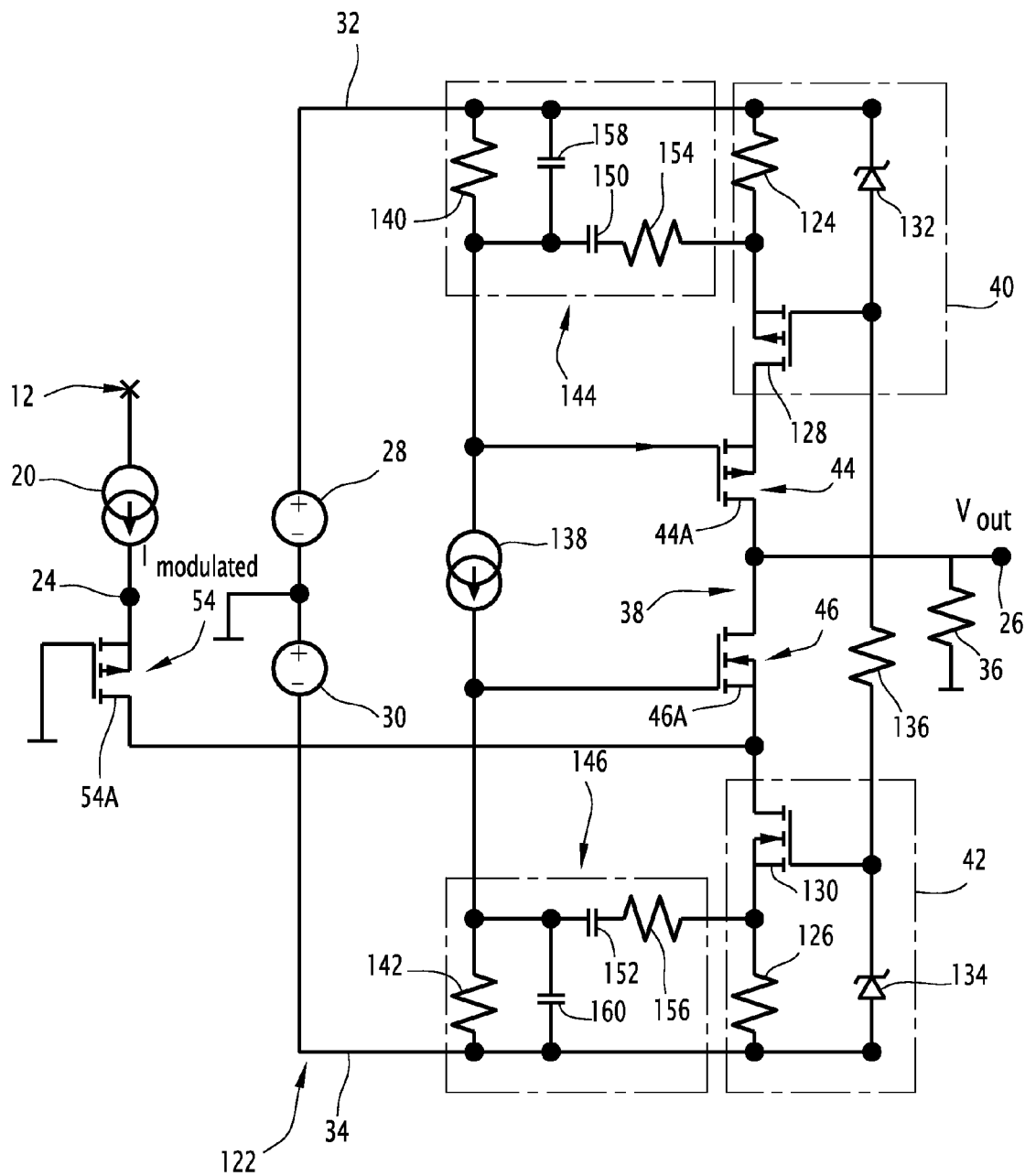
FIGS. 3 and 4 are electric diagrams of alternative embodiments of the current-voltage converter of FIG. 2.
Figure 4:
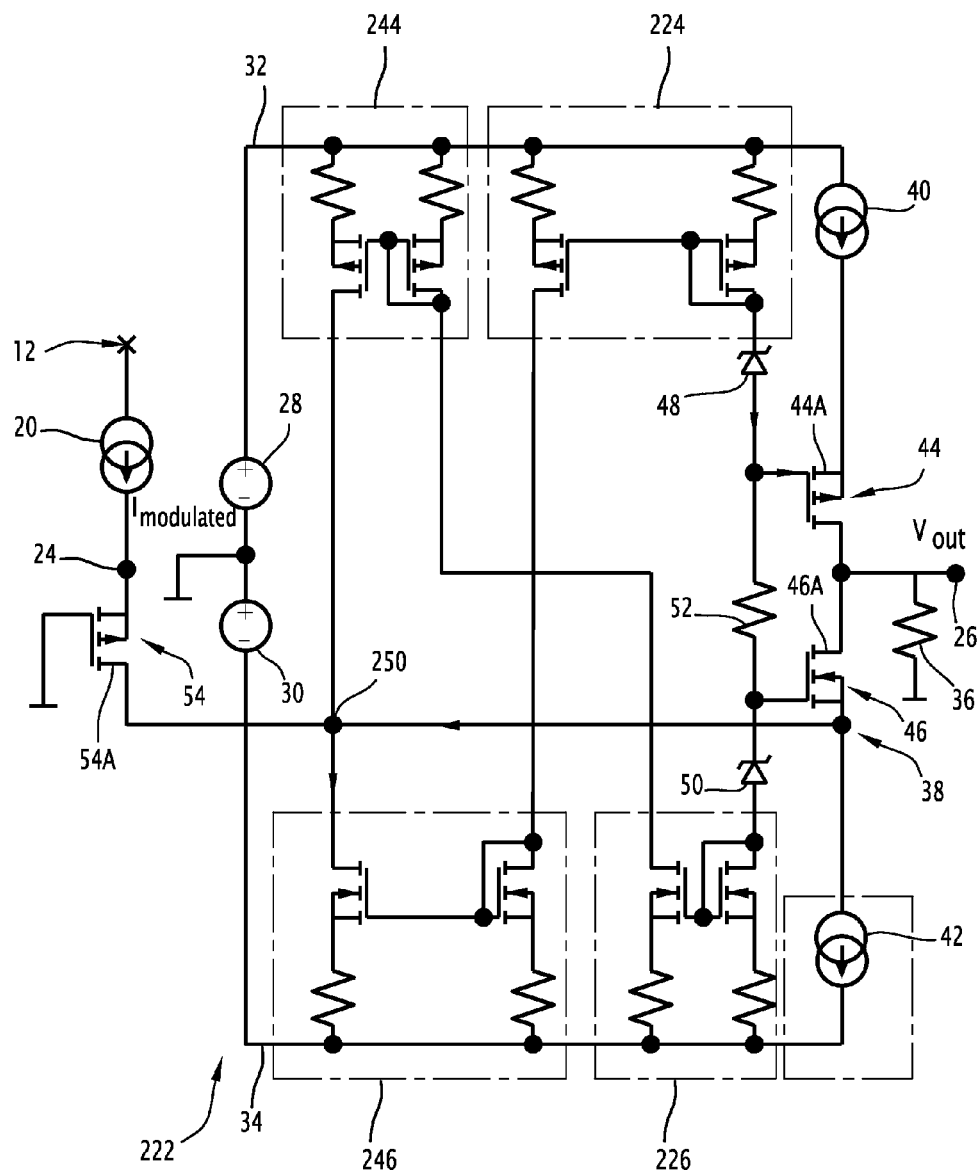

The circuits of FIGS. 3 and 4 provide a solution to the charging and discharging of parasitic capacitors by suppressing the harmonic distortion as a result, which may reach a relatively high level of the order of −70 dBc.

FIG. 3 considers again the elements of FIG. 2 completed with additional elements. The identical elements or the ones corresponding to those of FIG. 2 are designated with the same reference numbers and will not be described in detail again, since they are connected in an identical way.

In this embodiment, the constant current generators 40, 42 are each formed with a resistor 124, 126, one terminal of which is connected to the respective voltage bus, 32, 34, and the other terminal is connected to the associated cascode stage 44, 46, through a transistor 128, 130 of the MOS type, the gate of which is respectively connected to the voltage bus 32 and 34 through a Zener diode respectively 132, 134. The gates and anodes of the diodes 132, 134 are connected through a resistor 136 able to ensure the flow of a current through the diodes 132, 134 with an inverted or Zener bias.

In this embodiment, the gates of the transistors 44A, 46A of the cascode stages 44, 46 are connected together through a current generator 138 able to establish a constant current of the order of 0.8 mA. The terminal of the current generator 138, connected to the gate of the transistor 44 is connected to the voltage bus through a resistor 140 while the other terminal of the generator connected to the gate of the transistor 46A is connected to the voltage bus 44 through a resistor 142.

The circuit of FIG. 3 includes means 144, 146 for measuring the current absorbed by the cascode stage 44, 46 and means for re-injecting a current equal to the current absorbed in the current reflector circuit 38.

These means 144, 146 are formed in the embodiment of FIG. 3, by a connection respectively comprising in series, a capacitor 150, 152 and a resistor 154, 156. This connection connects the gate of the transistors 44A, 46A to the terminals of the resistors 124, 126 connected to the cascode stages 44, 46 through the transistors 128, 130.

The re-injection means are for example able to re-inject a current equal to the current absorbed in the current reflector circuit 38 for audible frequencies, such as frequencies of less than 20 kHz, and the circuits 144, 146 include means for stabilizing the voltage delivered on the output 26 before reducing the re-injection rate of the current for frequencies above audible frequencies, such as frequencies above 20 kHz. The re-injection rate is equal to the amount of re-injected current divided by the amount of absorbed current. In the exemplary embodiment of FIG. 3, a capacitor 158, 160 is positioned between each voltage bus 32, 34 and the gate of the transistors 44A, 46A. These capacitors 158, 160 form with resistors 154, 156, a low pass filter, avoiding the correction for frequencies above audible frequencies.

Alternatively, the circuits 144, 146 do not include any capacitor positioned between each voltage bus 32, 34 and the gate of the transistors 44A, 46A, the correction being then also carried out for high frequencies, such as frequencies above 20 kHz.

Thus, the circuits 144, 146 act for correcting the current generators 40, 42 by imposing that the latter re-inject a current equal to the current absorbed by the parasitic capacitances of the transistors 44A, 46A.

The circuits 144 and 146 act as a error current trap, the error current being the current through the gates of the transistors 44A and 46A which should have ideally remained through the drain-source dipole of these transistors. This current is trapped in the sense that it is re-injected, inside the current sources 40 and 42, in the actual branch from which it escaped, the drain-source junction of the transistors 44A and 46A, a junction which conveys the added current through the output resistor 36.

Still another embodiment is illustrated in FIG. 4, in which identical elements or those corresponding of FIG. 2 are designated by the same reference numbers.

In this embodiment, the means for measuring the current absorbed by each cascode stage 44, 46 include a current mirror circuit 224, 226, the input branch of which is placed on the circuit for controlling the gate of each transistor 44A, 46A.

As known per se, each current mirror circuit includes two transistors of the MOS type, the gates of which are connected together, the transistor of the input branch is mounted in series with a resistor and is interposed between the DC voltage bus 32, 34 and the Zener diode 48, 50. The output branches of the current mirror circuits 224, 226 also consisting of a transistor in series with a resistor are connected to the input branches of another current mirror circuit 244, 246 each forming an inverter. These current mirror circuits have their output branches connected together to the connection point of the input 24 to the current reflector circuit 38.

Thus, the current mirror circuits 224, 246 forming an inverter and the outputs of which are connected, ensuring re-injection into the reflector circuit 38 of the current absorbed by the transistors 44A, 46A, this current being measured in the control branches for these transistors by the current mirror circuits 224, 226.

It is thus conceivable that in this embodiment, a current with a value equal to the sum of the currents absorbed by the transistors 44A, 46A, be re-injected into the current reflector circuit 38 and therefore through the resistor 36, thereby compensating for the current required for charging or discharging the parasitic capacitances of the transistors 44A, 46A.

The respective frequency responses of the circuits of FIGS. 2, 3 and 4 are illustrated in FIG. 5. Each frequency response contains a combination of an expected fundamental frequency and of harmonic undesired frequencies corresponding to the harmonic distortion of the response of the circuit. The curve 402 illustrated as a thick continuous line, shows the response of the circuit of FIG. 2, the curve 403 in a thin continuous line, the response for the circuit of FIG. 3, and the curve in dotted line the response for the circuit of FIG. 4.

It is seen that for certain frequencies, such as frequencies of 2 and 3 kHz, the response is better for the circuit of FIG. 4 using current mirror circuits for measuring and re-injecting the current absorbed by the transistors, this response being poorer but of good quality for the circuits of FIG. 3, while the circuit of FIG. 2, even if it leads to exploitable results, has a higher harmonic distortion due to the absence of correction of the current absorbed by the transistors of the cascode stages.

The invention claimed is:

1. A current-voltage converter with a current reflector, the input current including a fixed component and a variable component, the converter including:
   an input for the current to be converted;
   an output for the converted voltage;
   two constant current sources each connected between the output and a respective reference voltage;
   at least one MOSFET transistor, mounted in series with each constant current source, and the gate of which is connected to one of the reference voltages; and
   a resistor for converting the current into a voltage, arranged between the output and ground, the input for the current to be converted being connected to the output through one of the MOSFET transistors;
   characterized in that it includes, for each MOSFET transistor, means for re-injecting into at least one of the current sources, a current equal to the current absorbed in the gates of the MOSFET transistors.

2. The converter according to claim 1, characterized in that it includes, for each MOSFET transistor, means for measuring the current absorbed by the MOSFET transistor.

3. The converter according to claim 2, characterized in that the means for measuring the current include a measurement current mirror circuit mounted on the circuit for controlling the gate of each MOSFET transistor, and the means for re-injecting the absorbed current in the gates of the MOSFET transistors comprise means for adding both currents obtained at the output of the measurement current mirrors and inverting the sign thereof, the output of the addition and inversion means being connected to the current source for adding to the drain current of one of the MOSFET transistors the opposite of the sum of the currents obtained at the output of the measurement current mirror circuits.

4. The converter according to claim 3, characterized in that it includes a MOSFET transistor, mounted in series at the input for the current to be converted, and the gate of which is connected to an electric ground.

5. The converter according to claim 4, characterized in that the means for adding both currents obtained at the output of the measurement current mirrors and inverting the sign thereof comprise for each current mirror a sign inversion current mirror mounted in series, the outputs of both sign inversion current mirrors being connected together to the drain of the MOSFET transistor mounted in series at the input.

6. The converter according to claim 1, characterized in that the means for re-injecting the absorbed current include means for injecting a connection signal into the current source associated with the MOSFET transistor so that the current source provides a current increased by the current absorbed by the MOSFET transistor.

7. The converter according to claim 1, characterized in that the re-injection means are able to re-inject a current equal to the current absorbed in the gates of the MOSFET transistors for audible frequencies, such as frequencies below 20 kHz, and in that it includes means for stabilizing the voltage delivered from the output in order to reduce the re-injection current rate for frequencies above audible frequencies, such as frequencies above 20 kHz, the re-injection rate being equal to the amount of re-injected current divided by the amount of absorbed current.

8. The converter according to claim 7, characterized in that the stabilization means include a low pass filter.

9. The converter according to claim 1, characterized in that it is without any operational amplifier.

10. The converter according to claim 1, characterized in that the intensity difference between both constant current sources is equal to the fixed component of the input current.

11. An input stage of a high fidelity amplifier having high linearity and low distortion level including a digital-analog converter with a current output and a current-voltage converter according to claim 1.

12. A high fidelity amplifier having high linearity and low distortion rate, characterized in that it includes an input stage according to claim 11, and an amplification stage connected in series to the input stage.

13. The amplifier according to claim 12, characterized in that the conversion resistor has a value greater than or equal to the difference between the extreme values of the output voltage of the amplification stage divided by the difference between the extreme values of the intensity of the current at the input of the current-voltage converter.

* * * * *